US008643132B2

(12) United States Patent
Chen et al.

(10) Patent No.: US 8,643,132 B2
(45) Date of Patent: Feb. 4, 2014

(54) IN-PIXEL HIGH DYNAMIC RANGE IMAGING

(75) Inventors: Gang Chen, San Jose, CA (US); Duli Mao, Sunnyvale, CA (US); Hsin-Chih Tai, San Jose, CA (US); Howard E. Rhodes, San Martin, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 80 days.

(21) Appl. No.: 13/155,969

(22) Filed: Jun. 8, 2011

(65) Prior Publication Data

US 2012/0313197 A1 Dec. 13, 2012

(51) Int. Cl.
*H01L 31/06* (2012.01)
*H01L 31/062* (2012.01)
*H01L 31/113* (2006.01)

(52) U.S. Cl.
USPC ............. 257/461; 257/292; 257/E31.075

(58) Field of Classification Search
USPC ......... 257/307, 312, 313, 296, 298, 300, 301, 257/516, E29.345, E21.364, E21.649, 257/E27.016, E27.048, E29.342, 596–597, 257/292, 461, 463, E31.075, E31.078, 257/E31.081, E31.84
See application file for complete search history.

(56) References Cited

U.S. PATENT DOCUMENTS

| | | | | |
|---|---|---|---|---|
| 5,627,402 A | * | 5/1997 | Takemura | 257/596 |
| 2004/0067600 A1 | * | 4/2004 | Chatterjee | 438/14 |
| 2005/0052554 A1 | * | 3/2005 | Sakurai et al. | 348/301 |
| 2006/0022246 A1 | * | 2/2006 | Honda | 257/296 |
| 2006/0103749 A1 | | 5/2006 | He | |
| 2009/0303371 A1 | * | 12/2009 | Watanabe et al. | 348/311 |

* cited by examiner

*Primary Examiner* — Daniel Luke
*Assistant Examiner* — Khaja Ahmad
(74) *Attorney, Agent, or Firm* — Blakely Sokoloff Taylor & Zafman LLP

(57) ABSTRACT

Embodiments of the invention describe providing high dynamic range imaging (HDRI or simply HDR) to an imaging pixel by coupling a floating diffusion node of the imaging pixel to a plurality of metal-oxide semiconductor (MOS) capacitance regions. It is understood that a MOS capacitance region only turns "on" (i.e., changes the overall capacitance of the floating diffusion node) when the voltage at the floating diffusion node (or a voltage difference between a gate node and the floating diffusion node) is greater than its threshold voltage; before the MOS capacitance region is "on" it does not contribute to the overall capacitance or conversion gain of the floating diffusion node.

Each of the MOS capacitance regions will have different threshold voltages, thereby turning "on" at different illumination conditions. This increases the dynamic range of the imaging pixel, thereby providing HDR for the host imaging system.

16 Claims, 7 Drawing Sheets

IN-PIXEL HIGH DYNAMIC RANGE IMAGING

FIELD

Embodiments of the invention generally pertain to image capture devices, and more particularly, but not exclusively, to enhancing the dynamic range of image capture devices.

BACKGROUND

An image capture device includes an image sensor and an imaging lens. The imaging lens focuses light onto the image sensor to form an image, and the image sensor converts the light into electric signals. The electric signals are output from the image capture device to other components of a host electronic system. The electronic system may be, for example, a mobile phone, a computer, a digital camera or a medical device.

As pixel cells become smaller, it becomes more difficult for the pixel cell to output a signal of adequate strength that can be easily deciphered by downstream signal processing. Moreover, there are demands on the image sensor to perform over a large range of lighting conditions, varying from low light conditions to bright light conditions. This performance capability is generally referred to as having high dynamic range imaging (HDRI or alternatively just HDR). Thus, prior art solutions for decreasing the size of the pixel cell limit the dynamic range of the pixel cell.

FIG. 1 is a diagram of a prior art four-transistor (4T) pixel cell included within an image sensor array. Pixel cell 100 includes light sensing element (i.e., photodiode) 101, transfer transistor 102, reset transistor 103, source-follower transistor 104 and row select transistor 105.

During operation, transfer transistor 102 receives transfer signal TX, which transfers the charge accumulated in photodiode 101 to floating diffusion node 106. Reset transistor 103 is coupled between power rail VDD and floating diffusion node 106 to reset pixel cell 100 (e.g., discharge or charge floating diffusion node 106 and photodiode 101 to a preset voltage) under control of reset signal RST.

Floating diffusion node 106 is coupled to control the gate terminal of source-follower transistor 104. Source-follower transistor 104 is coupled between power rail VDD and row select transistor 105. Row select transistor 105 selectively couples the output of pixel circuitry to the readout column 190 under control of row select signal RS.

In normal operation, photodiode 101 and floating diffusion node 106 are reset by temporarily asserting the reset signal RST and transfer signal TX. The accumulating window (i.e., exposure period) is commenced by de-asserting the transfer signal TX and permitting incident light to charge photodiode 101. As photo-generated electrons accumulate on photodiode 101, its voltage decreases (electrons are negative charge carriers). The voltage or charge on photodiode 101 is indicative of the intensity of the light incident on photodiode 101 during the exposure period. At the end of the exposure period, the reset signal RST is de-asserted to isolate floating diffusion node 106 and transfer signal TX is asserted to couple photodiode 101 to floating diffusion node 106. The charge transfer causes the voltage of floating diffusion node 106 to drop by an amount proportional to photo-generated electrons accumulated on photodiode 101 during the exposure period.

Floating diffusion node 106 is designed to be relatively small in order to achieve high transfer or conversion gain; however, in high illumination conditions, the amount of charge (signal) produced by photodiode 101 may be greater than the capacity of floating diffusion node 106. This will result in saturation of the floating diffusion node, thereby producing a reduced dynamic range, as well as reduced signal-to-noise ratio (SNR).

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

Descriptions of certain details and implementations follow, including a description of the figures, which may depict some or all of the embodiments described below, as well as discussing other potential embodiments or implementations of the inventive concepts presented herein. An overview of embodiments of the invention is provided below, followed by a more detailed description with reference to the drawings.

DETAILED DESCRIPTION

Embodiments of the invention describe providing high dynamic range imaging (HDRI or simply HDR) to an imaging pixel by coupling a floating diffusion node of the imaging pixel to a plurality of metal-oxide semiconductor (MOS) capacitance regions. It is understood that a MOS capacitance region only turns "on" (i.e., changes the overall capacitance of the floating diffusion node) when the voltage at the floating diffusion node (or a voltage difference between a gate node and the floating diffusion node) is greater than the threshold voltage of the MOS capacitance region; before the MOS capacitance region is "on" it does not contribute to the overall capacitance or conversion gain of the imaging pixel.

Each of the plurality of MOS capacitance regions utilized by embodiments of the invention may have different threshold voltages, thereby turning "on" at different illumination conditions. This increases the dynamic range of the imaging pixel, thereby providing HDR for the host imaging system, as well as increasing the signal-to-noise ratio (SNR) of the imaging system.

In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Figure 2:
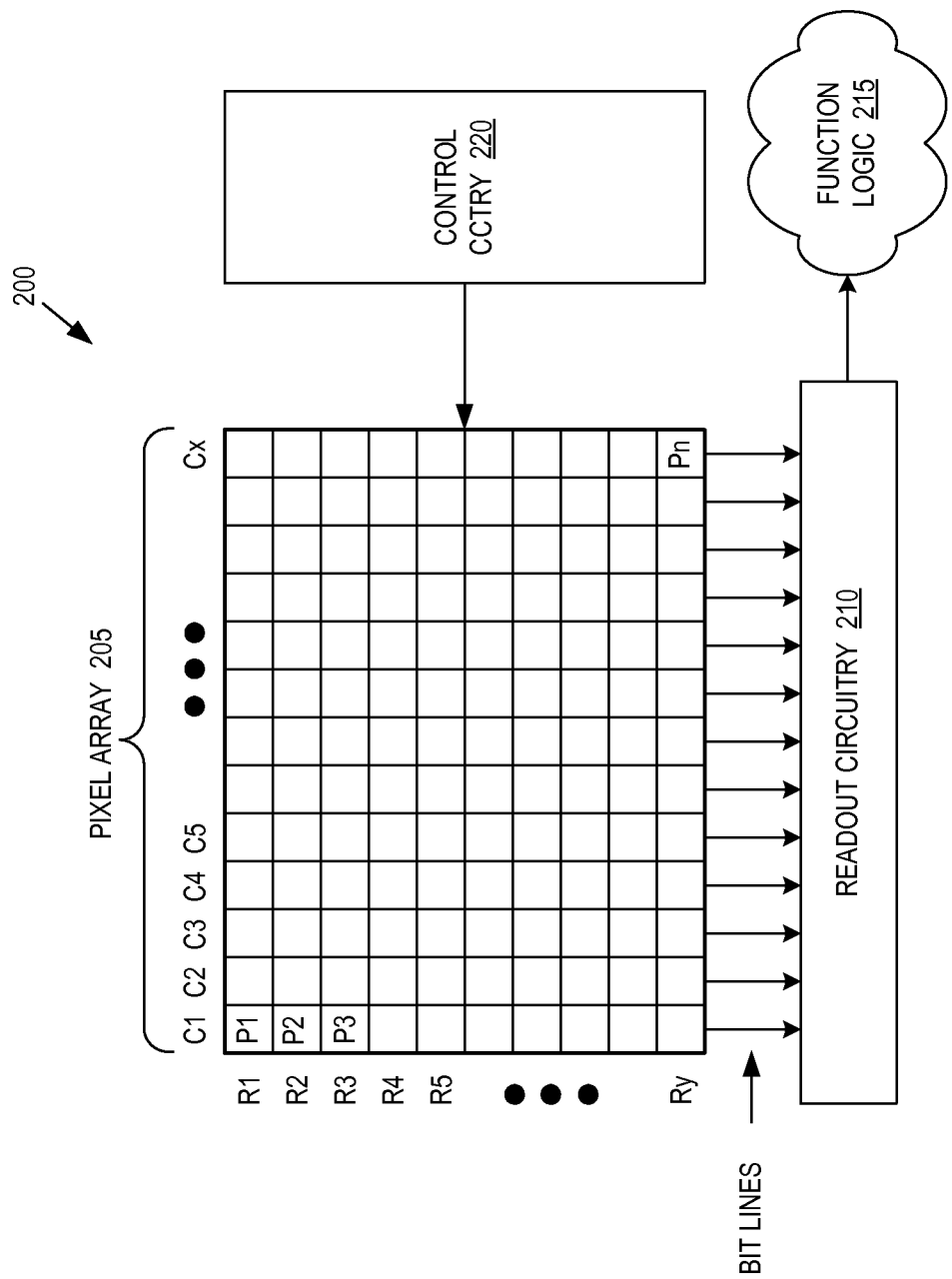
FIG. 2 is a block diagram illustrating an imaging system in accordance with an embodiment of the disclosure.

FIG. 2 is a block diagram illustrating an imaging system in accordance with an embodiment of the disclosure. The illustrated embodiment imaging system 200 includes pixel array 205, readout circuitry 210, function logic 215 and control circuitry 220.

Pixel array 205 is a two-dimensional (2D) array of imaging sensor cells or pixel cells (e.g., pixels P1, P2, . . . , Pn). In one embodiment, each pixel cell is a complementary metal-oxide-semiconductor (CMOS) imaging pixel. In another embodiment, each pixel cell is a charged-coupled device (CCD) imaging pixel. Pixel array 205 may be implemented as a front-side illuminated image sensor or a backside illuminated image sensor. As illustrated, each pixel cell is arranged into a row (e.g., rows R1 to Ry) and a column (e.g., column C1 to Cx) to acquire image data of a person, place or object, which can then be used to render an image of the person, place or object.

After each pixel has acquired its image data or image charge, the image data is readout by readout circuitry 210 and transferred to function logic 215. Readout circuitry 210 may include amplification circuitry, analog-to-digital (ADC) conversion circuitry or otherwise. Function logic 215 may simply store the image data or even manipulate the image data by applying post image effects (e.g., crop, rotate, remove red eye, adjust brightness, adjust contrast or otherwise). In one embodiment, readout circuitry 210 may readout a row of image data at a time along readout column lines (illustrated as generic bit lines) or may readout the image data using a variety of other techniques (not illustrated), such as serial readout, column readout along readout row lines, or a full parallel readout of all pixels simultaneously.

Control circuitry 220 is coupled to pixel array 205 and includes logic for controlling operational characteristics of pixel array 205. For example, reset, row select and transfer signals may be generated by control circuitry 220. Control circuitry 220 may also generate a shutter signal for controlling image acquisition. In one embodiment, the shutter signal is a global shutter signal for simultaneously enabling all pixels within pixel array 205 to simultaneously capture their respective image data during a single acquisition window. In an alternative embodiment, the shutter signal is a rolling shutter signal whereby each row, column, or group of pixels is sequentially enabled during consecutive acquisition windows.

In one embodiment, imaging system 200 is subsystem included in an electronic system. Said electronic system may be a mobile phone, a computer, a digital camera or a medical device, and may further include an operating unit comprising a computing or processing unit related to the electronic system. For example, said electronic system may be a mobile phone, and said operating unit may be a telephone unit that is responsible for telephone operation of the system.

Figure 1:
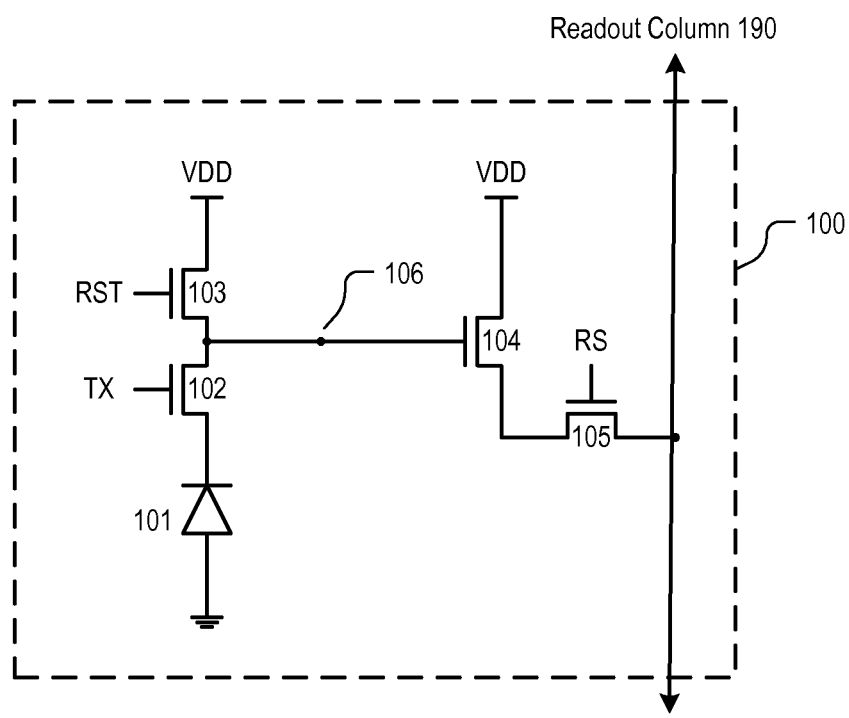
FIG. 1 is a diagram of a prior art four-transistor (4T) pixel cell.
Figure 3:
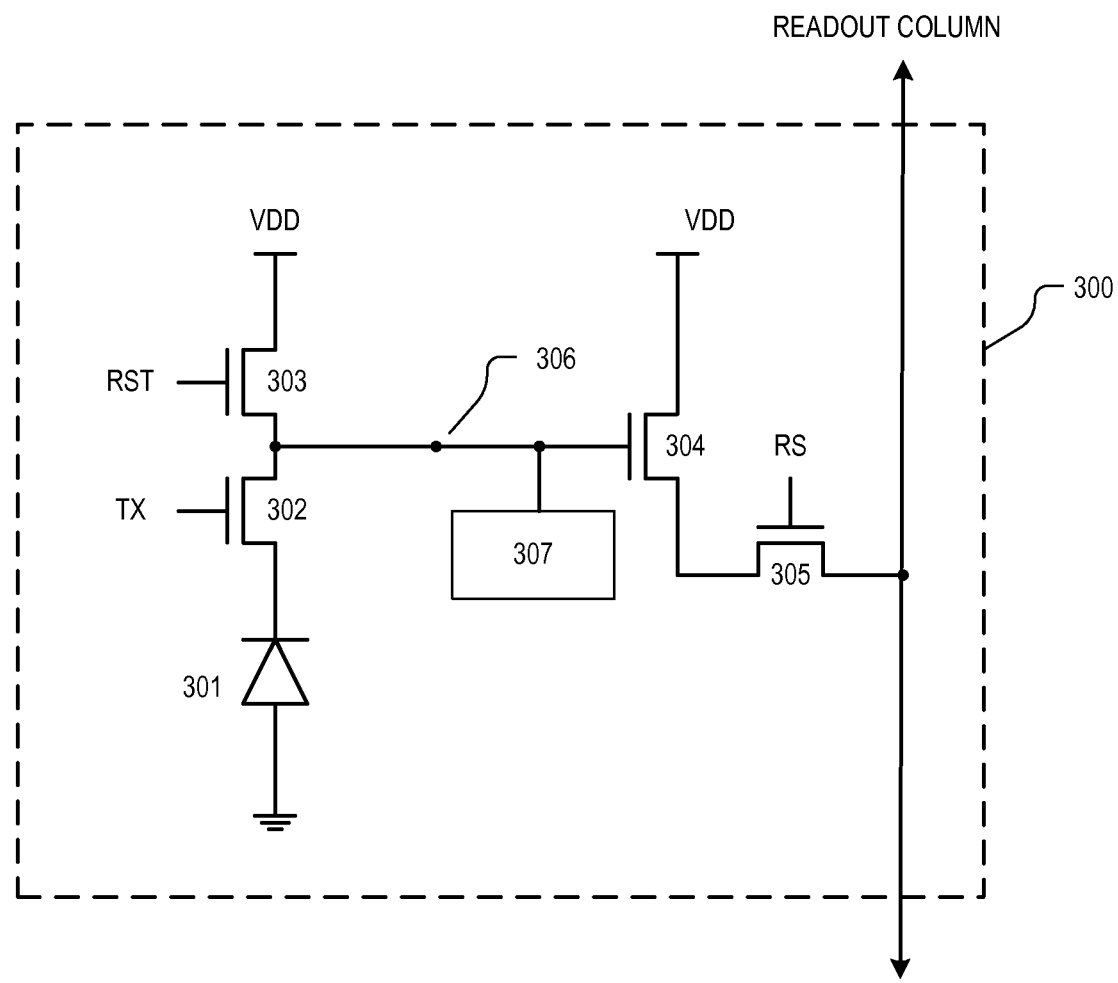
FIG. 3 is a diagram of a 4T pixel cell in accordance with an embodiment of the disclosure.

FIG. 3 is a diagram of a four-transistor (4T) pixel cell in accordance with an embodiment of the disclosure. Pixel cell 300 is included in an array of pixel cells, as described above and illustrated in pixel array 205 of FIG. 2. Pixel cell 300 includes photodiode 301, transfer transistor 302, reset transistor 303, source-follower transistor 304 and row select transistor 305. These elements function similar to the 4T pixel cell of FIG. 1.

In this embodiment, pixel cell 300 also includes variable capacitance element 307, which includes a plurality of MOS capacitance regions. As described below, the presence of a plurality of MOS capacitance regions allows for the capacitance of floating diffusion node 306 to vary under certain illumination conditions—i.e., when the voltage difference between gate terminal 308 and floating diffusion node 306 is greater than a threshold voltage value of one of the MOS capacitance regions.

Figure 4:
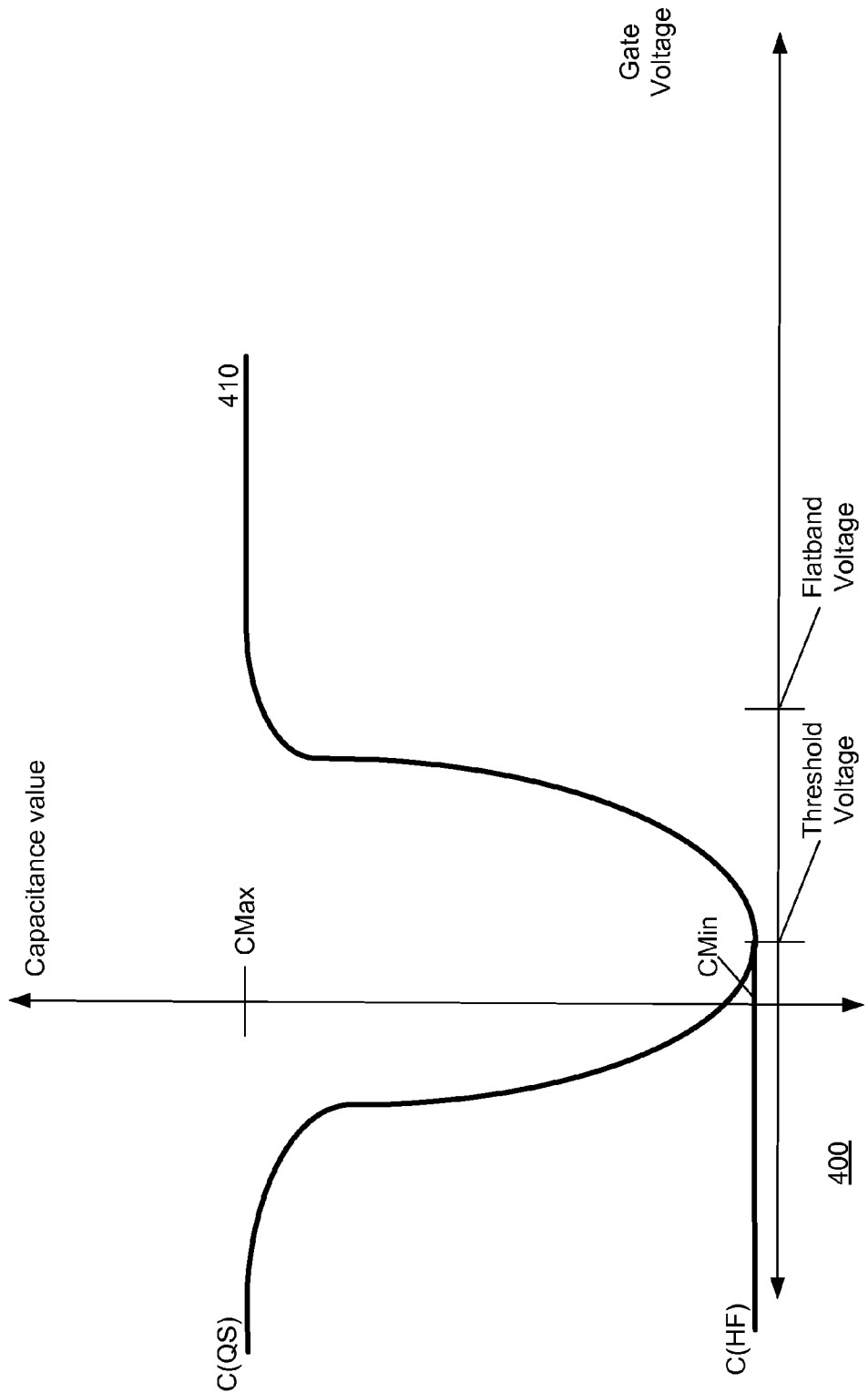
FIG. 4 is a graph of a capacitance vs. gate voltage curve for a MOS capacitance region in accordance with an embodiment of the disclosure.

FIG. 4 is a graph of a capacitance value vs. gate voltage curve of a MOS capacitance region according to an embodiment of the disclosure. Graph 400 shows curve 410, which illustrates capacitance values for a MOS capacitance region with a p+ gate and an n− body. It is to be understood that for a MOS capacitance region comprising an n+ gate over p− body, curve 410 would be mirrored (i.e., 'flipped').

When the voltage applied (i.e., gate voltage) to the MOS capacitance region is less than threshold voltage $V_T$, high-frequency capacitance $C_{HF}$ value is at $C_{MIN}$, while quasi-static capacitance $C_{QS}$ is at $C_{Max}$. For the uses of embodiments of the invention, $C_{HF}$ is to only be considered and $C_{QS}$ will not contribute to the overall capacitance of a pixel cell including said MOS capacitance region.

When the voltage applied to the capacitor is between threshold voltage $V_T$ and flat-band voltage $V_{FB}$, the capacitance value of the MOS capacitance region is a function of the applied voltage—i.e., the greater the applied voltage exceeds threshold voltage $V_T$, the higher the capacitance value of the MOS capacitance region is. When the voltage applied to the MOS capacitance region exceeds flat-band voltage $V_{FB}$, the capacitance value of the MOS capacitance region reaches is maximum value $C_{MAX}$.

When a MOS capacitance region is operatively coupled to a floating diffusion node of a 4T pixel cell (e.g., floating diffusion node 306 of FIG. 3), then under high illumination light conditions the MOS capacitance region may have a capacitance value that exceeds its $C_{MIN}$ value during a readout operation. This, in effect, increases the capacitance of the floating diffusion node; however, in low-light conditions, the MOS capacitance region may have a capacitance value at its $C_{MIN}$ value; in some embodiments of the invention, said $C_{MIN}$ value is or is close to zero so that the capacitance value of the floating diffusion node will only includes its intrinsic capacitance (which as described above, for small floating diffusion nodes, is a relatively small capacitance value).

Figure 5A:
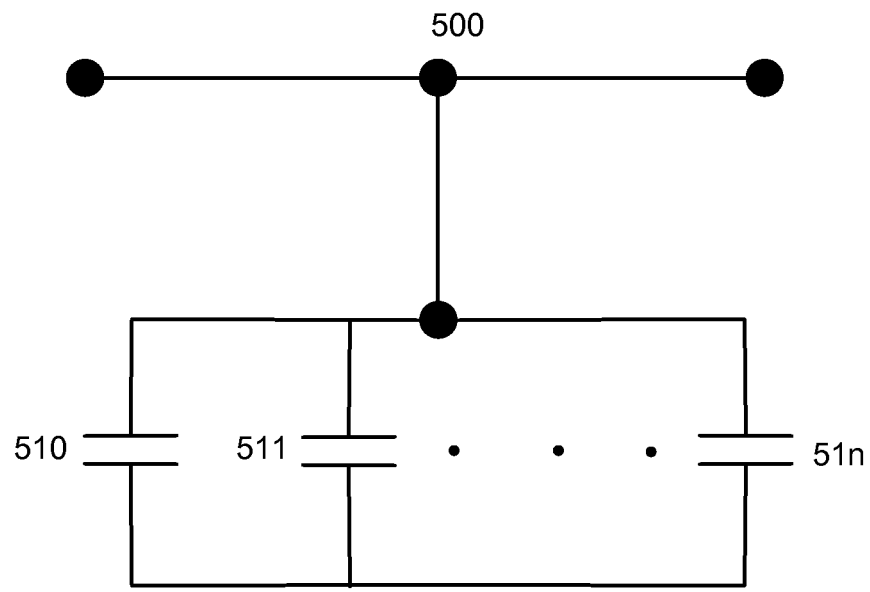
FIGS. 5A and 5B are illustrations of a plurality of MOS capacitance regions coupled to a floating diffusion node in accordance with embodiments of the disclosure.
Figure 5B:
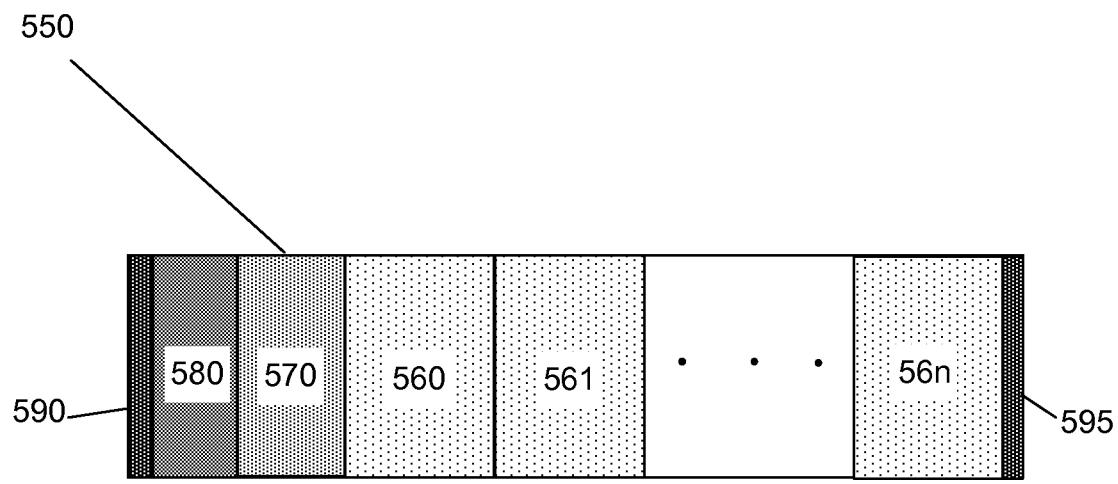

FIGS. 5A and 5B are illustrations of a plurality of MOS capacitance regions coupled to a floating diffusion node in accordance with embodiments of the disclosure. In FIG. 5A, a plurality of MOS capacitors (i.e., capacitors 510, 511, . . . , 51n) coupled in parallel and are coupled to floating diffusion node 500. It is to be understood that in other embodiments, elements 510-51n may be a plurality of MOS transistors to provide variable capacitance.

Although not shown, it is to be understood that floating diffusion node 500 is included in an image pixel cell, similar to floating diffusion node 306 in pixel cell 300 of FIG. 3.

In this embodiment, each of capacitors 510-51n will have different threshold voltage $V_T$ values, thereby contributing to the overall capacitance of floating diffusion node 500 at different voltage levels. In one embodiment, the flat-band voltage $V_{FB}$ value of capacitor 510 may be the same value as the threshold voltage $V_T$ value of 511, the flat-band voltage $V_{FB}$ value of capacitor 511 may be the same value as the threshold voltage $V_T$ of capacitor 512 (not shown), and so forth for all capacitors 511-51*n* (although in other embodiments, there may be some overlap of the capacitors' $V_T$-$V_{FB}$ ranges). Furthermore, each of the capacitors may have a minimum capacitance value $C_{MIN}$ close to zero. Thus, the total capacitance at floating diffusion node 500 will be a function of the voltage received at the floating diffusion node (i.e., the intensity of the light received at the respective image sensor) for a voltage range of $V_T$ of capacitor 510 to $V_{FB}$ of capacitor 51*n*, but the capacitance of the floating diffusion node will not be greater than its intrinsic capacitance for voltages lower than $V_T$ of capacitor 510.

FIG. 5B illustrates an alternative embodiment of a plurality of capacitance regions. In this embodiment, rather than utilizing a plurality of different capacitors as shown in FIG. 5A, a single MOS capacitor including a plurality of distinct dopant regions is utilized. MOS capacitor 550 includes contacts 590 and 595, "metal" layer 580, oxide layer 570 and dopant regions 560, 561, . . . , 56*n*. Each of dopant regions 560-56*n* will have a different doping level to affect each regions' threshold voltage $V_T$ and flat-band voltage $V_{FB}$ values. Thus, it is to be understood that capacitor 550 is a more simple and efficient functional equivalent to plurality of capacitors 510-51*n* of FIG. 5A.

Figure 6:
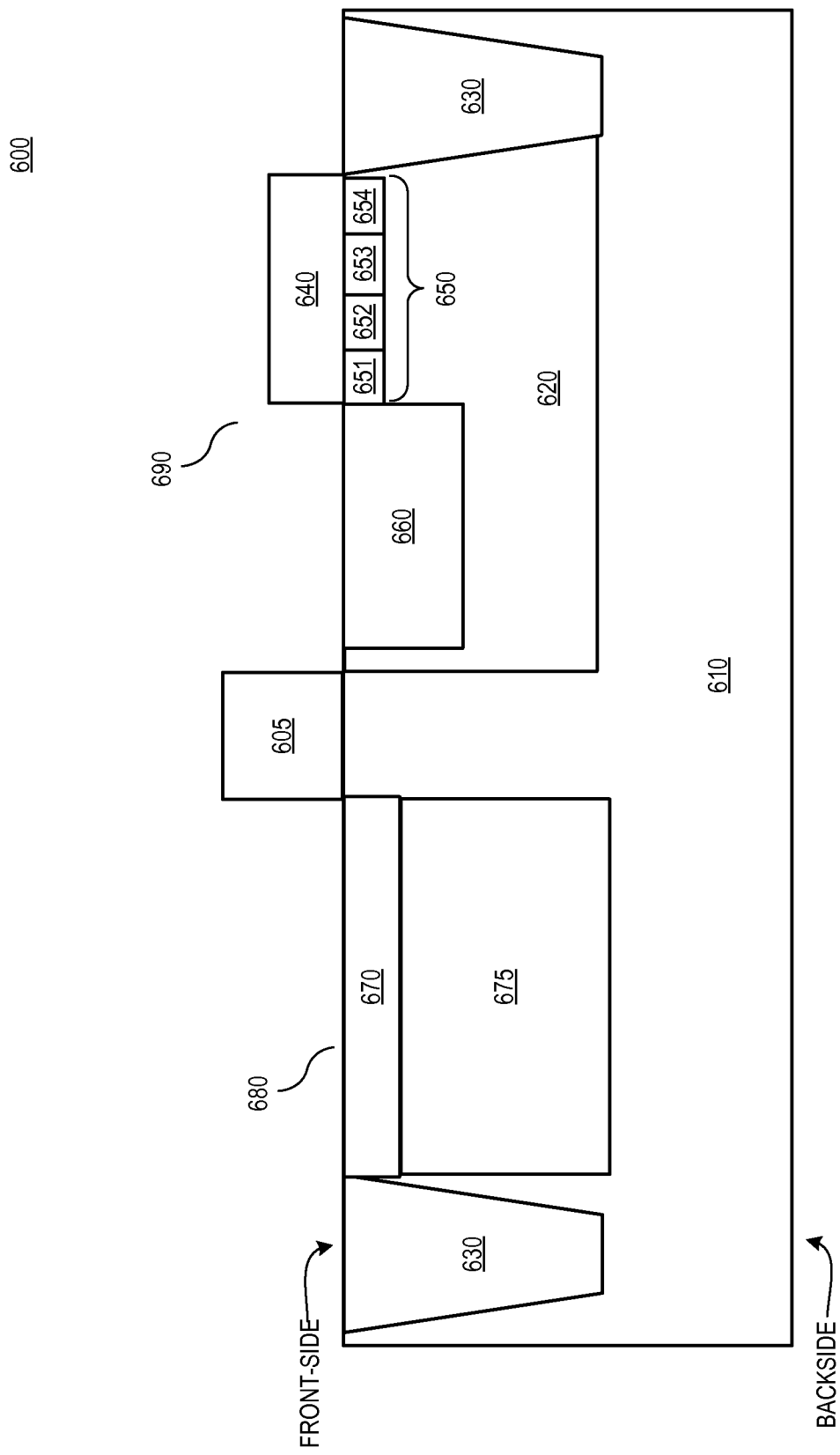
FIG. 6 is a cross-sectional diagram of a pixel cell utilizing a MOS capacitor having a plurality of dopant regions in accordance with an embodiment of the disclosure.

FIG. 6 is a cross-sectional diagram of a pixel cell utilizing a MOS capacitor having a plurality of dopant regions in accordance with an embodiment of the disclosure. In this embodiment, 4T pixel cell 600 includes photodiode 680 formed on the front-side of substrate 610. In this embodiment, photodiode 680 is comprised of p-type passivation or pinning layer 670 and n-type photosensitive region 675. P-type diffusion well 620 is formed within substrate 610. Floating diffusion 660, MOS capacitor 690, a reset transistor, a source-follower transistor and a row select transistor (not shown) may also be formed within p-type diffusion well 620 or similarly constructed diffusion wells. During operation of pixel 600, transfer transistor 605 receives a transfer signal to transfer the charge accumulated in photodiode 680 to floating diffusion 660. Shallow trench isolation (STI) regions 630 separate pixel 600 from other pixel cells within the respective pixel array.

In this embodiment, under bright light conditions MOS capacitor 690 increases the capacitance of floating diffusion node 660. As described above, one way to vary the capacitance provided by MOS capacitor 690 is to vary the threshold voltages of the plurality of included capacitance regions. In this embodiment, said variable capacitance is accomplished by varying the doping levels of region 650 under gate 640 of MOS capacitor 690 (e.g., region 650 may comprise silicon and gate 640 may comprise polysilicon).

In this embodiment, region 650 under gate 640 comprises dopant regions 651, 652, 653 and 654. Thus, MOS capacitor 690 may be seen as providing four variable capacitances to floating diffusion node 660. When a voltage applied to gate 640 of MOS capacitor 690 overcomes the threshold voltage created by dopant region 651, variable capacitance $C_{MOS1}$ is applied to floating diffusion node 660. When a voltage applied to gate 640 overcomes the threshold voltage created by dopant region 652 (which in this embodiment is "higher" than the threshold voltage of dopant region 651), variable capacitance $C_{MOS2}$ (in addition to $C_{MOS1}$) is applied to floating diffusion node 660, and so forth for dopant regions 653 and 654 which may provide variable capacitance $C_{MOS3}$ and $C_{MOS4}$ respectively to floating diffusion 660. In other embodiments, region 650 may comprise any amount of dopant regions greater than two.

In this embodiment, region 650 has a dopant profile in which dopant concentrations increasing from dopant region 651 closest to floating diffusion node 660, to dopant region 654, closest to STI 630. With a dopant profile in which dopant concentration increase from floating diffusion node 660 to STI 630, the capacitance provided by MOS capacitor 690 to floating diffusion 660 may increase (or decrease) with an increased (or decreased) voltage applied to gate terminal 640. MOS capacitor 690, with multiple dopant regions 651-654, thus provides varying capacitance to floating diffusion 660. It is to be understood that pixels and an imaging array utilizing the above described embodiments of the invention will have an increased dynamic range, thereby enabling HDR for the imaging array.

In this embodiment dopant regions 651-654 are p-type, as is diffusion well 620. In other embodiments, dopants regions 651-654 are n-type. In other embodiments, dopant regions 651-654 may not all be the same type (e.g., dopant regions 651 and 652 may be n-type while dopant regions 653 and 654 are p-type, and so forth).

In the illustrated embodiment photodiode 680 and other elements of pixel cell 600 are formed in substrate 600. In other embodiments, pixel cell 600 may be formed in an epitaxial layer disposed on the substrate. In other embodiments, pixel cell 600 may have a diffusion region (not shown in FIG. 6) between gate 640 and STI 630.

In the illustrated embodiment, gate 640 may be n-doped or undoped. In other embodiments of the invention, gate 640 may be p-doped which may reduce the threshold voltages of MOS capacitor 690. Gate 640 may be n-doped to increase the threshold voltages of MOS capacitor 690.

In the illustrated embodiment, dopant regions 651, 652, 653 and 654 are formed in the region under gate 640 to provide variable capacitance to MOS capacitor 690. In other embodiments of the invention, dopant regions 651, 652, 653 and 654 may be formed in gate 640. In other words, the dopant concentration of gate 640 may vary to provide variable capacitance to MOS capacitor 690.

Capacitance regions 651-654 may have contiguous (or nearly contiguous) non-overlapping threshold voltage—flat-band voltage value ranges, thereby creating a capacitance range wherein capacitance at floating diffusion node 660 is a function of the voltage when the voltage is between the threshold voltage of capacitance region 651 and the flat-band voltage of capacitance region 654 as described below.

Figure 7:
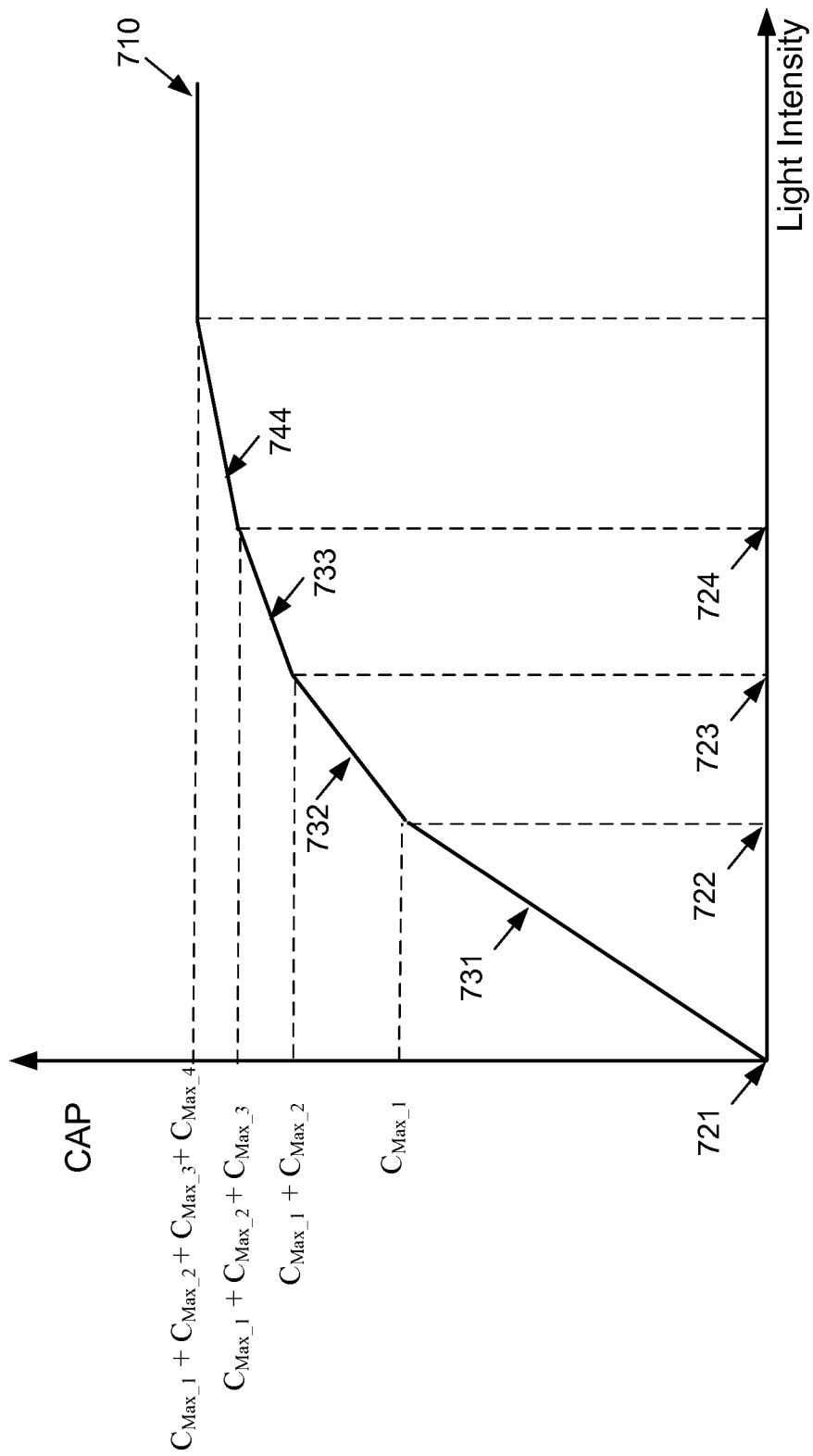
FIG. 7 is a graph showing the relationship between light intensity and capacitance at a floating diffusion node of a pixel cell in accordance with an embodiment of the disclosure.

FIG. 7 is a graph showing the relationship between light intensity and capacitance at a floating diffusion node of a pixel cell in accordance with an embodiment of the disclosure. Graph 700 includes curve 710 that represents the capacitance of floating diffusion node 660 of FIG. 6 based on the light intensity received by photodiode 680 (it is to be understood that the dynamic range of pixel cell 600 corresponds to the capacitance at the floating diffusion node, and is thus also represented by curve 710).

The capacitance at light intensity value 721 represents the intrinsic capacitance of floating diffusion node 660. In this embodiment, when light intensity exceeds value 721, a voltage will be applied to gate 640 that exceeds the threshold voltage of dopant region 651 thereby providing a variable capacitance shown as segment 731. In this embodiment, when the light intensity approaches value 722, dopant region 651 has reached its flat-band voltage (i.e., reached its maximum capacitance shown as $C_{Max\_1}$); however, when light intensity value exceeds value 722, a voltage will be applied to gate 640 that exceeds the threshold voltage of dopant region 652 thereby providing a variable capacitance shown as segment 732 (wherein said variable capacitance includes $C_{Max\_1}$, since dopant region 651 has reached its flat-band voltage).

Similarly, as the light intensity value exceeds values 723 and 724, voltages will be applied to gate 640 that exceed the threshold voltages of dopant regions 653 and 654, respectively, thereby providing a variable capacitance shown as segments 733 and 734, respectively.

In this embodiment, in order to achieve a relatively smooth capacitance/dynamic range curve as shown in curve 710, dopant regions 651-654 may be varied by area and/or by dopant profiles in order to achieve different $C_{Max}$ values. Thus, $C_{Max\_4}$ of dopant region 654 is less than $C_{Max\_3}$ of dopant region 653, which is less than $C_{Max\_2}$ of dopant region 652, which is less than $C_{Max\_1}$ of dopant region 651. Furthermore, in this embodiment, the flat-band voltage value of dopant region 651 is or is close to the threshold voltage value of dopant region 652, the flat-band voltage value of dopant region 652 is or is close to the threshold voltage value of dopant region 653, and so forth.

The light intensity level received by the photodiode (and the image sensor) may be monitored by any number of conventional ways. The output from the image sensor can be examined for its brightness level. As can be appreciated by those skilled in the art, nearly every image sensor has circuitry for automatic gain control and exposure control. By determining the strength of the signal output from the pixels, the ambient light level can be determined. A dedicated light-sensitive device outside the imaging area of the image sensor can be used to monitor the light intensity level received by the image sensor. By comparing the light intensity level with one (or more) thresholds, such as thresholds 485, 486 and 487 of FIG. 4B, the voltage level applied to gate 640 can be determined.

Various components referred to above as processes, servers, or tools described herein may be a means for performing the functions described. Each component described herein includes software or hardware, or a combination of these. Each and all components may be implemented as software modules, hardware modules, special-purpose hardware (e.g., application specific hardware, ASICs, DSPs, etc.), embedded controllers, hardwired circuitry, hardware logic, etc. Software content (e.g., data, instructions, configuration) may be provided via an article of manufacture including a non-transitory, tangible computer or machine readable storage medium, which provides content that represents instructions that can be executed. The content may result in a computer performing various functions/operations described herein.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

The invention claimed is:

1. An imaging sensor pixel comprising:
    a floating diffusion (FD) region;
    a photosensitive element to acquire an image charge;
    a single metal oxide-semiconductor (MOS) capacitor, comprising a plurality of MOS capacitance regions each having a minimum capacitance value, coupled to the FD region to increase the capacitance of the FD region, wherein each of the MOS capacitance regions comprises a different dopant level and a different threshold voltage value based on its dopant level, and the plurality of MOS capacitance regions are arranged in the single MOS capacitor based on an ascending order of each regions' threshold voltage value, and a dopant concentration of the plurality of MOS capacitance regions increases from a dopant region closest to the FD region to a dopant region closest to a shallow trench isolation region, and the plurality of MOS capacitance regions are formed in a diffusion well having a dopant type same as the dopant type of the plurality of MOS capacitance regions; and
    a transfer gate to transfer the image charge from the photosensitive element to the FD region for controlling a capacitance of the single MOS capacitor by causing one or more of the plurality of MOS capacitance regions to have a capacitance value greater than its minimum capacitance value when the image charge transferred from the photosensitive element to the FD region exceeds the respective MOS capacitance region's threshold voltage value.

2. The imaging sensor pixel of claim 1, wherein a flat-band voltage of one of the plurality of MOS capacitance regions is equal to a threshold voltage of another one of the plurality of MOS capacitance regions.

3. The imaging sensor pixel of claim 1, wherein each of the plurality of MOS capacitance regions comprises different maximum capacitance values.

4. The imaging sensor pixel of claim 1, wherein each of the plurality of MOS capacitance regions' minimum capacitance value is zero.

5. The imaging sensor pixel of claim 1, wherein the photosensitive element is disposed within a semiconductor die for accumulating an image charge in response to light incident upon a backside of the imaging sensor pixel.

6. The imaging sensor pixel of claim 1, wherein the photosensitive element is disposed within a semiconductor die for accumulating an image charge in response to light incident upon a front-side of the imaging sensor pixel.

7. The imaging sensor pixel of claim 1, wherein the imaging sensor pixel comprises a complimentary metal-oxide semiconductor (CMOS) image sensor.

8. The imaging sensor pixel of claim 1, wherein the imaging sensor pixel comprises a charged-coupled device (CCD) image sensor.

9. A system comprising:
    an array of imaging pixels wherein each imaging pixel includes:
    a floating diffusion (FD) region,
    a photosensitive element to acquire an image charge,
    a single metal oxide-semiconductor (MOS) capacitor, comprising a plurality of MOS capacitance regions each having a minimum capacitance value, coupled to the FD region to increase the capacitance of the FD region, wherein each of the MOS capacitance regions comprises a different dopant level and a different threshold voltage value based on its dopant level, and the plurality of MOS capacitance regions are arranged in the single MOS capacitor based on an ascending order of each regions' threshold voltage value, and a dopant concentration of the plurality of MOS capacitance regions increases from a dopant region closest to the FD region to a dopant region closest to a shallow trench isolation region, and the plurality of MOS capacitance regions are formed in a diffusion well having a dopant type same as the dopant type of the plurality of MOS capacitance regions, and a transfer gate to transfer the image charge from the photosensitive element to the FD region for controlling a capacitance of the single MOS capacitor by causing one or more of the plurality of MOS capacitance regions to have a capacitance value greater than its minimum capacitance value when the image charge transferred from the photosensitive element to the FD region exceeds the respective MOS capacitance region's threshold voltage value;

a controlling unit coupled to the array of imaging pixels to control image data capture of the array of imaging pixels; and readout circuitry coupled to the array of imaging pixels to readout the image data from each of the imaging pixels.

10. The system of claim 9 wherein, for each imaging pixel of the array of imaging pixels, a flat-band voltage of one of the plurality of MOS capacitance regions is equal to a threshold voltage of another one of the plurality of MOS capacitance regions.

11. The system of claim 9 wherein, for each imaging pixel of the array of imaging pixels, each of the plurality of MOS capacitance regions comprises different maximum capacitance values.

12. The system of claim 9 wherein, for each imaging pixel of the array of imaging pixels, each of the plurality of MOS capacitance regions' minimum capacitance value is zero.

13. The system of claim 9 wherein, for each imaging pixel of the array of imaging pixels, the photosensitive element is disposed within a semiconductor die for accumulating an image charge in response to light incident upon a backside of the imaging pixel.

14. The system of claim 9 wherein, for each imaging pixel of the array of imaging pixels, the photosensitive element is disposed within a semiconductor die for accumulating an image charge in response to light incident upon a front-side of the imaging pixel.

15. The system of claim 9, wherein each of the imaging pixels comprises a complimentary metal-oxide semiconductor (CMOS) image sensor.

16. The system of claim 9, wherein each of the imaging pixels comprises a charged-coupled device (CCD) image sensor.

* * * * *